US009941347B2

(12) United States Patent
Shapiro et al.

(10) Patent No.: US 9,941,347 B2
(45) Date of Patent: Apr. 10, 2018

(54) FLOATING BODY CONTACT CIRCUIT METHOD FOR IMPROVING ESD PERFORMANCE AND SWITCHING SPEED

(71) Applicant: Peregrine Semiconductor Corporation, San Diego, CA (US)

(72) Inventors: Eric S. Shapiro, San Diego, CA (US); Matt Allison, Oceanside, CA (US)

(73) Assignee: pSemi Corporation, San Diego, CA (US)

( * ) Notice: Subject to any disclaimer, the term of this patent is extended or adjusted under 35 U.S.C. 154(b) by 0 days.

(21) Appl. No.: 15/495,819

(22) Filed: Apr. 24, 2017

(65) Prior Publication Data

US 2017/0338298 A1    Nov. 23, 2017

Related U.S. Application Data

(62) Division of application No. 14/521,331, filed on Oct. 22, 2014, now abandoned.

(60) Provisional application No. 61/906,843, filed on Nov. 20, 2013.

(51) Int. Cl.
| | |
|---|---|
| H01L 49/02 | (2006.01) |
| H01L 27/02 | (2006.01) |
| H01L 29/78 | (2006.01) |
| H03K 17/0412 | (2006.01) |
| H01L 27/12 | (2006.01) |
| H01L 27/06 | (2006.01) |
| H03K 17/16 | (2006.01) |

(52) U.S. Cl.
CPC ............ *H01L 28/20* (2013.01); *H01L 27/027* (2013.01); *H01L 29/78* (2013.01); *H01L 27/0629* (2013.01); *H01L 27/1203* (2013.01); *H03K 17/04123* (2013.01); *H03K 17/163* (2013.01)

(58) Field of Classification Search
CPC ... H01L 28/20; H01L 27/027; H01L 27/0629; H01L 27/1203; H01L 27/0248; H01L 27/0266; H01L 27/0288; H01L 29/78; H01L 29/0603; H03K 17/08; H03K 17/04123; H03K 17/163
See application file for complete search history.

(56) References Cited

U.S. PATENT DOCUMENTS

| | | | |
|---|---|---|---|
| 5,506,539 | A | 4/1996 | Kelly et al. |
| 6,172,525 | B1 | 1/2001 | Wennekamp |
| 7,910,993 | B2 | 3/2011 | Brindle et al. |
| 9,160,328 | B2 * | 10/2015 | Altunkilic ............ H03K 17/161 |
| 9,406,695 | B2 | 8/2016 | Shapiro et al. |

(Continued)

OTHER PUBLICATIONS

Smith, Stephen C., Office Action received from the USPTO dated Mar. 10, 2016 for U.S. Appl. No. 14/521,331, 7 pgs.

(Continued)

*Primary Examiner* — Cheung Lee
*Assistant Examiner* — Stephen C Smith
(74) *Attorney, Agent, or Firm* — Jaquez Land Greenhaus LLP; Martin J. Jaquez, Esq.; John Land, Esq.

(57) ABSTRACT

Embodiments of systems, methods, and apparatus for improving ESD performance and switching time for semiconductor devices including metal-oxide-semiconductor (MOS) field effect transistors (FETs), and particularly to MOSFETs fabricated on Semiconductor-On-Insulator ("SOI") and Silicon-On-Sapphire ("SOS") substrates.

42 Claims, 12 Drawing Sheets

(56) References Cited

U.S. PATENT DOCUMENTS

| | | |
|---|---|---|
| 2010/0148266 A1 | 6/2010 | Foley et al. |
| 2013/0234778 A1 | 9/2013 | Kuwabara et al. |
| 2014/0009212 A1* | 1/2014 | Altunkilic ........ H03K 17/08104 327/427 |
| 2014/0009214 A1* | 1/2014 | Altunkilic ............ H03K 17/161 327/427 |
| 2014/0284662 A1 | 9/2014 | Ikeda |
| 2015/0022256 A1 | 1/2015 | Sprinkle et al. |
| 2015/0028383 A1 | 1/2015 | Voss et al. |
| 2015/0137246 A1 | 5/2015 | Shapiro et al. |

OTHER PUBLICATIONS

Smith, Stephen C., Office Action received from the USPTO dated Jun. 2, 2016 for U.S. Appl. No. 14/521,331, 16 pgs.
Smith, Stephen C., Final Office Action received from the USPTO dated Jan. 26, 2017 for U.S. Appl. No. 14/521,331, 201 pgs.
Shapiro, et al., Response filed in the USPTO dated May 10, 2016 for U.S. Appl. No. 14/521,331, 6 pgs.
Shapiro, et al., Response filed in the USPTO dated Sep. 23, 2016 for U.S. Appl. No. 14/521,331, 9 pgs.

* cited by examiner

FLOATING BODY CONTACT CIRCUIT METHOD FOR IMPROVING ESD PERFORMANCE AND SWITCHING SPEED

CROSS-REFERENCE TO RELATED APPLICATIONS

The present application is a divisional of U.S. application Ser. No. 14/521,331 filed on Oct. 22, 2014, entitled "Floating Body Contact Circuit Method for Improving ESD Performance and Switching Speed", the disclosure of which is incorporated herein by reference in its entirety. Application Ser. No. 14/521,331 claims the benefit of priority from U.S. Provisional Patent Application No. 61/906,843, filed Nov. 20, 2013, entitled "Floating Body Contact Circuit Method for Improving ESD Performance and Switching Speed", the entire disclosure of which is hereby incorporated by reference.

TECHNICAL FIELD

Various embodiments described herein relate generally to systems, methods, and apparatus for improving ESD performance and switching time for semiconductor devices, in particular floating body semiconductor devices including metal-oxide-semiconductor (MOS) field effect transistors (FETs), and more particularly to MOSFETs fabricated on Semiconductor-On-Insulator ("SOI") and Silicon-On-Sapphire ("SOS") substrates.

BACKGROUND INFORMATION

It may be desirable to improve ESD performance and switching time for semiconductor devices including metal-oxide-semiconductor (MOS) field effect transistors (FETs), and particularly to MOSFETs fabricated on Semiconductor-On-Insulator ("SOI") and Silicon-On-Sapphire ("SOS") substrates, the present invention provides system, apparatus, and methods for same.

DETAILED DESCRIPTION

Figure 1B:
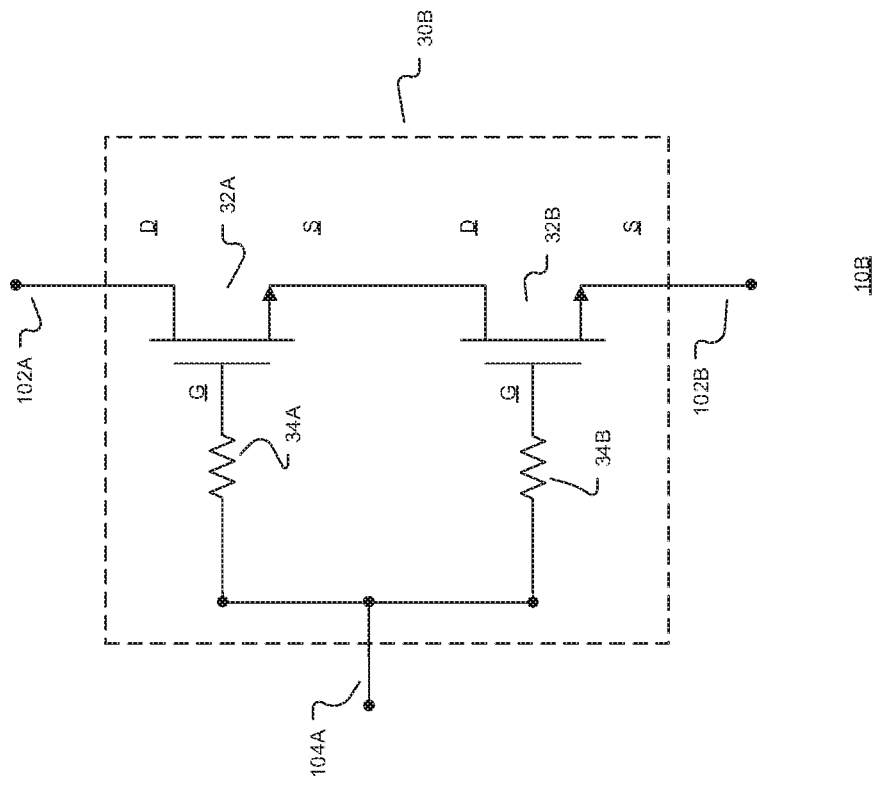
FIG. 1B is a simplified block diagram of a switch architecture with stacked semiconductor devices according to various embodiments.
Figure 1A:
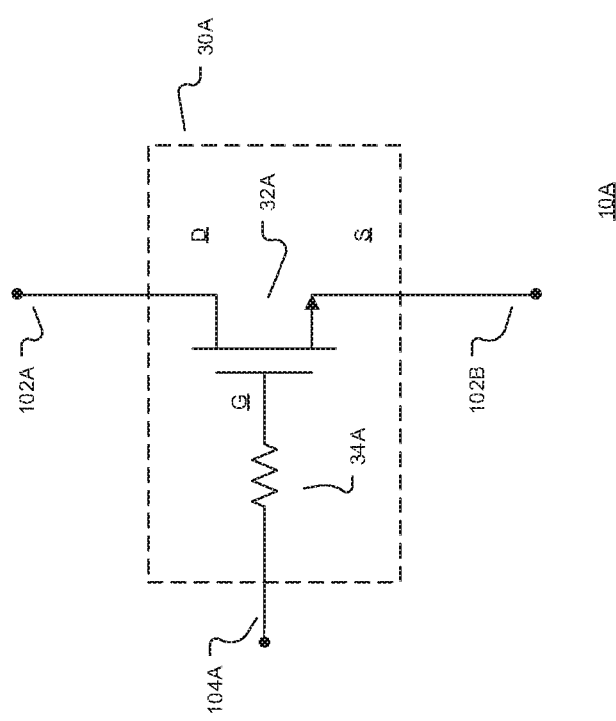
FIG. 1A is a simplified block diagram of a switch architecture according to various embodiments.

FIG. 1A is a simplified block diagram of a circuit architecture 10A according to various embodiments. As shown in FIG. 1A, the circuit architecture 10A may include a circuit module 30A, an input port 102A, an output port 102B, and a control signal port 104A. In an embodiment, the circuit module 30A may be used as a switch, including a radio frequency (RF) switch. The circuit or switch module 30A may modulate a signal on the input port 102A to the output port 102B based on the control signal 104A. As shown in FIG. 1A, the circuit module 30A may include a semiconductor device or transistor 32A and a resistor 34A. The resistor 34A may couple the control signal 104A to the semiconductor transistor 32A gate (G). In an embodiment, the transistor 32A drain (D) or source (S) may be coupled to the input port 102A and the transistor 32A source (S) or drain (D) may be coupled to the output port 102B.

It is noted that the elements of FIG. 1A (and other FIG. 1B) may include voltage, current, or energy sensitive elements including the semiconductor transistor (32A, FIG. 1A, 32B, FIG. 1B, 132A, FIG. 3A, 132B, FIG. 3B) and other elements 34A, (34B, FIG. 1B, 134A, 136A, FIG. 3A, 134B, 136B, FIG. 3B). These elements and architectures 10A, 10B (FIG. 1B), 100A-100C (FIGS. 2A-2C), 110A-110B (FIGS. 3A-3B), and 140A-140B (FIGS. 4A-4B), and 150A-150C (FIGS. 5A-5B) may be part of components of electronic devices that are subject to electro-static discharge (ESD) events including transmission line pulses (TLP) that may be generated by a human body or other sources.

The electronic devices may include portable and non-portable devices, the portable devices may include mobile phones, personal data assistants (PDAs), tablets, laptops, digital cameras, digital audio and video players, and other devices including ESD sensitive elements or modules. The non-portable devices may include any device including electronic components including automotive, communication, test equipment, medical, RADAR, and satellite devices. It is noted that a human body induced TLP may reach 35,000 volts and have a short rise time, on the order of nanoseconds. Such an ESD event may cause a gate-oxide punch-through in an integrated circuit element including Complementary metal-oxide-semiconductor (CMOS), metal-oxide-semiconductor field-effect transistor (MOSFET), other type field-effect transistor (FET), silicon on insulator (SOI), silicon on sapphire (SOS), or other semiconductor device and damage resistors 34A, 34B, 134A, 134B, FETs 32A, 32B, 132A-132C, and diodes 136A, 136B.

In an embodiment, a semiconductor 32A may be floating body type semiconductor including an N-type MOSFET (NMOSFET) or P-type MOSFET (PMOSFET) formed on an insulator including a silicon on insulator (SOI) or silicon on sapphire (SOS). During an off state (when the source-to-gate voltage Vsg) is not sufficient to turn on the gate (allow conduction from the source to the drain) but the Vsg is not insignificant, an accumulated charge may form in the semiconductor body and operate in an accumulated charge regime (ACR) described in more detail below with reference to FIGS. 3A to 3C. Accumulated charge in a semiconductor body may introduce harmonic distortion and intermodulation distortion to a signal applied the semiconductor 32A (such as a signal on port 102A). Accumulated charge in a semiconductor body may also introduce non-linear parasitic capacitance to the device 32A.

Figure 3C:
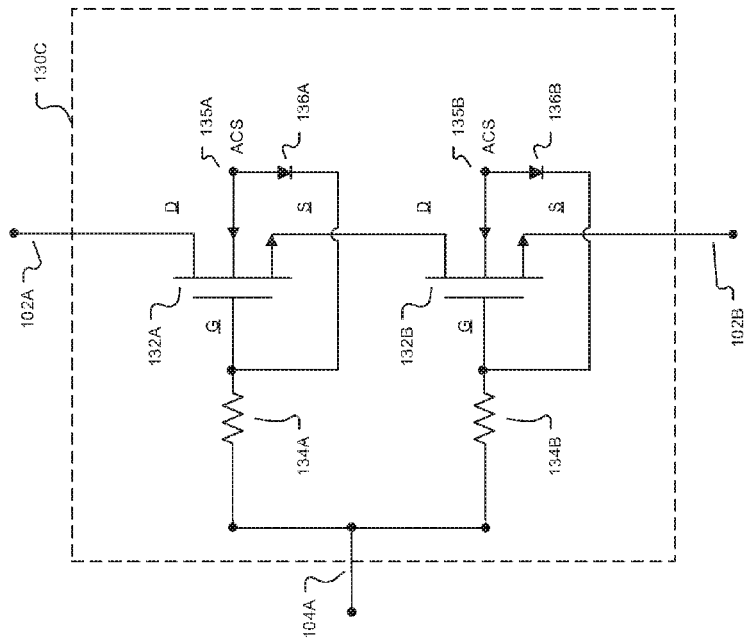
FIG. 3C is a simplified block diagram of a circuit architecture with stacked semiconductor devices and accumulated charge sink modules according to various embodiments.
Figure 3A:
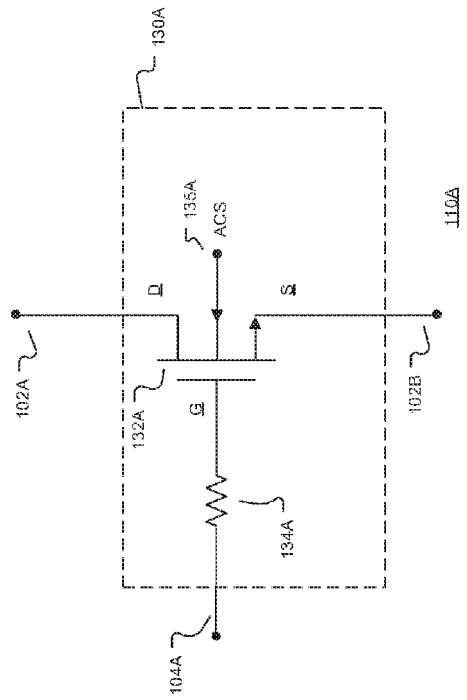
FIG. 3A is a simplified block diagram of a circuit architecture including a semiconductor device with an accumulated charge sink according to various embodiments.

In an embodiment, a semiconductor device 132A (FIG. 3A) may include an accumulated charge sink (ACS) 135A (FIG. 3A). The ACS 135A may be used to reduce or eliminate the accumulated charge on the semiconductor body. It is noted that the drain-to-source breakdown voltage (BVDSS) may be reduced in a semiconductor device 32A operating in an ACR due to the reduction in resistance between the source and drain due to the accumulated charge. Such a reduction in BVDSS may affect the electric shock discharge (ESD) capability of module including one or more semiconductor devices 32A, 32B operating in ACR. This change in ESD handling capability may be due to the smaller overall breakdown voltage of stacked semiconductors 32A, 32B and the modules 30B reduced ability to absorb an ESD across the stacked semiconductors 32A, 32B. Accordingly, architecture 10A, 10B semiconductors 32A, 32B may include an ACS 135A to enable accumulated charge to be removed or reduced in the semiconductors 32A, 32B such as shown for semiconductors 132A, 132B shown in FIG. 3A to 3C.

In order to limit an ESD strike current applied to a transistor 132A, the gate resistor 134A may be made large. A transistor 132A gate (G) may have a parasitic gate capacitance between itself and the source (Cgs) and the drain (Cgd). A larger gate resistor 134A in combination with the Cgs and Cgd parasitic capacitance may introduce an unacceptable time delay (RC time constant) for the transistor 132A (switching time, Tsw). FIG. 1B is a simplified block diagram of stacked circuit architecture 10B according to various embodiments. As shown in FIG. 1B, the stacked circuit architecture 10B may include a circuit module 30B, an input port 102A, an output port 102B, and a control signal port 104A. In an embodiment, the circuit module 30B may be used as a switch including an RF switch. The circuit or switch module 30B may modulate a signal on the input port 102A to the output port 102B based on a control signal 104A. As shown in FIG. 1B the module 30B may include a plurality of stacked semiconductor devices or transistors 32A, 32B and resistors 34A, 34B. In an embodiment, each resistor 34A, 34B may couple a control signal 104A to a semiconductor transistor 32A, 32B gate (G). In an embodiment, the transistor 32A drain (D) may be coupled to the input port 102A and its source (S) may be coupled to a downstream transistor 32B drain (D). The transistor 32B source (S) may be coupled to the output port 102B.

In an embodiment, the semiconductor transistors 32A, 32B may be SOI or SOS devices (formed on an insulating substrate). Further, the semiconductor devices 32A, 32B may be NMOSFETs formed on an insulator. The resistors 34A, 34B may enable the transistors 32A, 32B to each handle a predetermined voltage, about 2.5 to 3 volts in an embodiment. The stacked transistors 32A, 32B of module 30B may handle twice the voltage of a single transistor 32A. In an embodiment, due to the isolation between transistors 32A, 32B created by their formation on SOI or SOS (floating body type transistors). The semiconductor transistors 32A, 32B may be sized (gate, source, drain, and body width and length on die) to handle a predetermined minimum voltage and have a desired maximum switching time Tsw (affected by the gate width). A circuit module 30B switching time may be vary as function of each transistor 32A, 32B gate width and the ohmic size of each coupled gate resistor 34A, 34B, their effective RC time constant due in part to the parasitic capacitance Cgs and Cgd of the transistors 32A, 32B.

In an embodiment, an ESD across the ports 102A, 120B may be distributed between the transistors 32A, 32B as a function of the gate resistors 34A, 34B and the transistors 32A, 32B parasitic capacitances, Cgs, Cds. As noted, accumulated charge in the transistor 32A, 32B body may also affect the distribution of an ESD across the transistors 32A, 32B. Larger gate resistors 34A, 34B may reduce the ESD energy received by both transistors 32A, 32B. Further, as noted an ESD event or strike may be short in duration. A transistor's 32A, 32B gate width may be selected to enable faster switching (reduce formed parasitic capacitance, Cgs, Cgd) and enable a transistor 32A, 32B to process higher frequency ESD events. As noted above, larger gate resistors (in the order hundreds of kilo-ohms in an embodiment) may enable a circuit or switch module 30B to process larger ESD events, 2 kilo-volts in an embodiment. Larger gate resistors 34A, 34B may, however increase the switching time (Tsw) or RC time constant of a circuit module 30B, making the module 30B unusable or unsuitable for some applications including some radio frequency (RF) switching applications. Stacking semiconductor devices 32A, 32B with high gate resistance may also increase the insertion loss for a signal modulated between the ports 102A, 102B by the control signal 104A.

As explained with reference to FIG. 1C below, a MOSFET transistor formed on an insulator (floating body transistor) may inherently be able to absorb or redirect ESD event energy up to certain levels without damaging the operative transistor body area near the gate region 54B, source region 52A, and drain region 52B during an ESD event. The effective parasitic capacitance, Cgs, Cgd of transistors 32A, 32B may be able to absorb the energy from a high frequency ESD event as a function of the gate resistors 34A, 34B and transistor's 32A, 32B physical construction (width, length, number of fingers for gate, source, drain, and body).

As noted, a transistor's 32A, 32B gate resistor's 34A, 34B size may be linearly related to the maximum ESD strike or event that the corresponding transistor 32A, 32B may be able to handle or absorb without physical damage. The current processed by a transistor 32A, 32B during an ESD event may be proportional to the transistor's gate resistor 32A, 32B. Accordingly it may be desirable to have a large gate resistor 34A, 34B to improve a circuit modules' 30A, 30B ESD performance or handling. As noted, a larger gate resistor, 34A, 34B, however may decrease the switching speed of the corresponding semiconductor device 32A, 32B. In an embodiment, 10A, 10B, the resistor 34A, 34B sizing may be selected based on the maximum acceptable switching time or the minimum acceptable ESD strike or event energy the corresponding transistor(s) 32A, 32B must absorb without damage. In addition, a circuit modules' 30B stack size (number of semiconductors 32A, 32B) may be limited. In an embodiment, based on the maximum acceptable insertion loss at the switch module 30B. Accordingly, in a system employing a circuit module 30A, 30B, the ESD performance, Tsw, and insertion loss may be balanced or sacrificed depending on the system operation requirements.

Figure 1C:
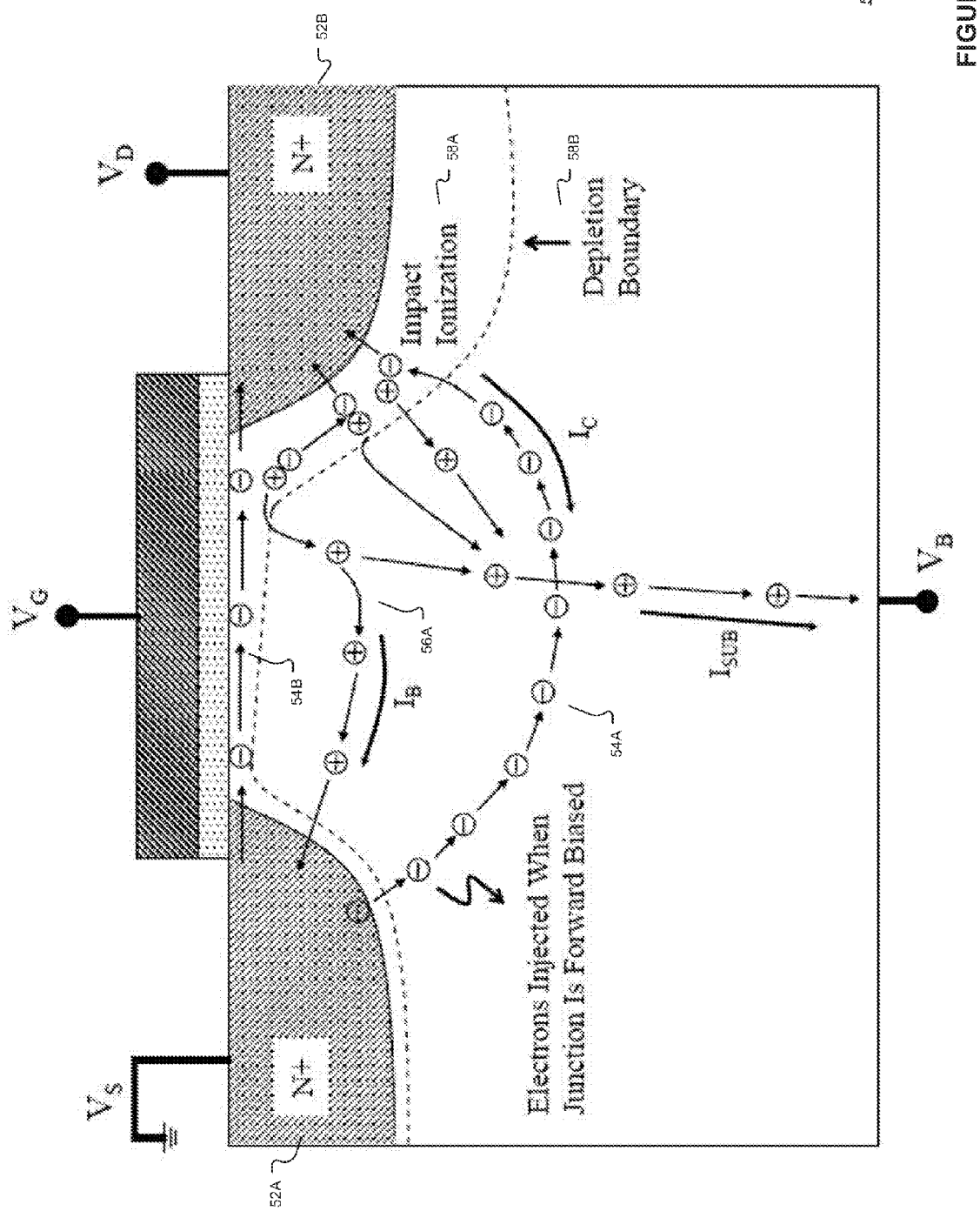
FIG. 1C is a simplified diagram of an electro-static discharge (ESD) strike effect to an N-type Complementary metal-oxide-semiconductor (CMOS) on insulator according to various embodiments.
Figure 3B:
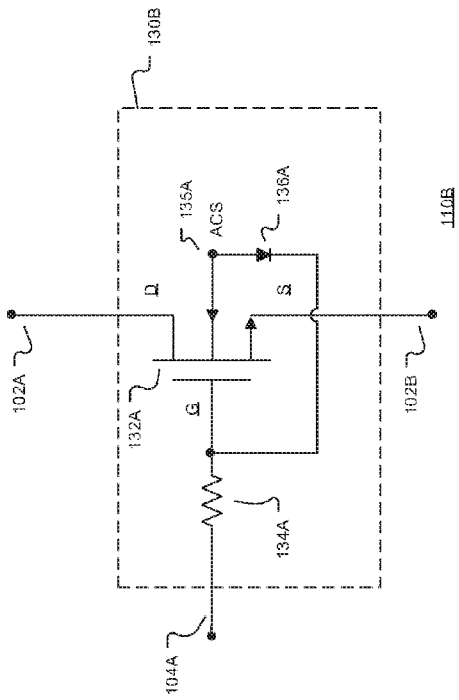
FIG. 3B is a simplified block diagram of a circuit architecture including a semiconductor device and an accumulated charge sink module according to various embodiments.
Figure 3D:
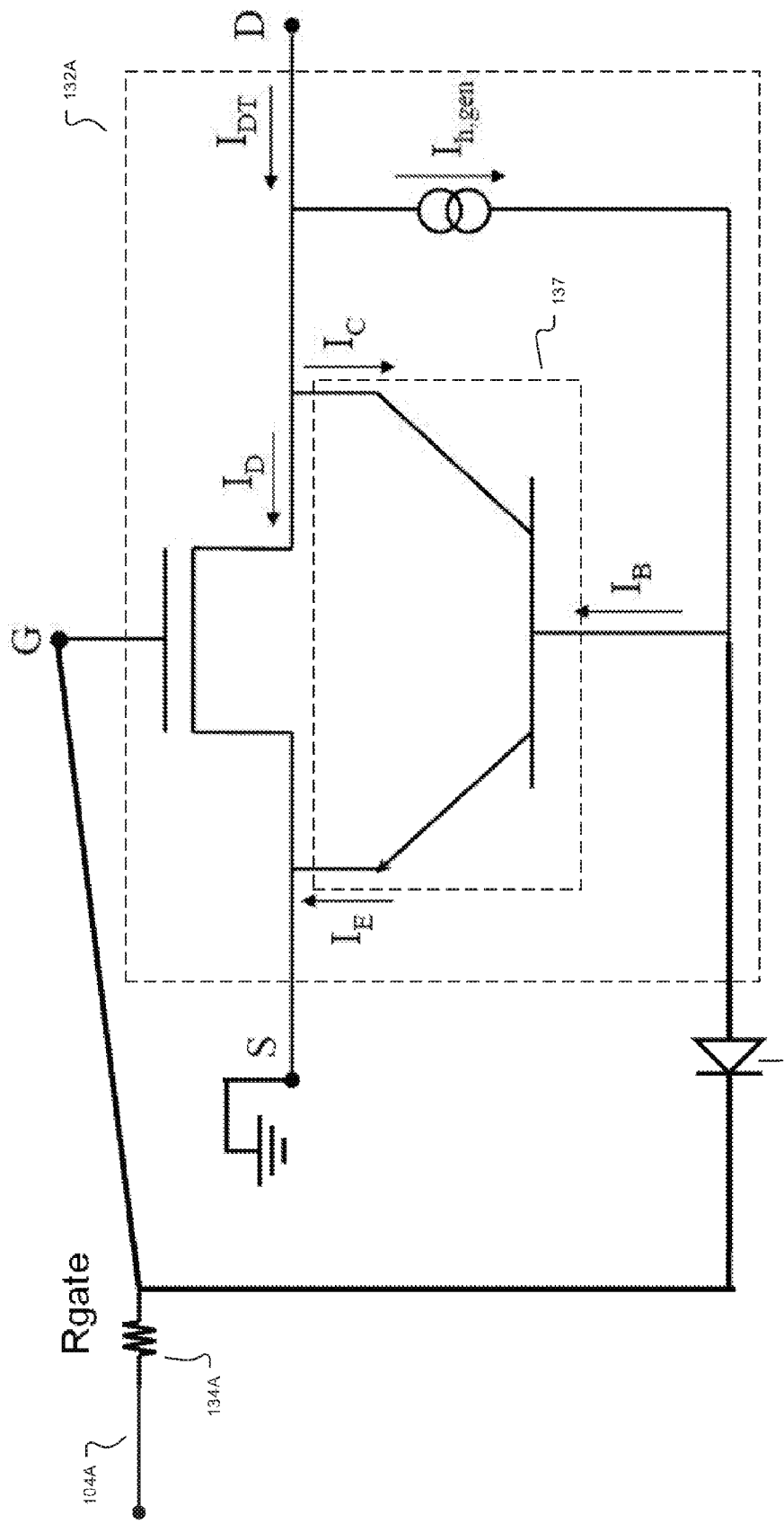
FIG. 3D is a simplified diagram of a circuit module current model, the module including an N type MOS semiconductor and an accumulated charge sink module according to various embodiments.

FIG. 1C is a simplified diagram of the effect of an electro-static discharge (ESD) strike on an N-type metal-oxide-semiconductor (MOSFET) on insulator according to various embodiments. FIG. 3D is current flow diagram 120 for circuit module 120 (similar to circuit 130B in FIG. 3B) during an ESD strike. The circuit module 120 may include a MOSFET and an ACS circuit 136A (a diode in an embodiment) coupling the MOSFET body ($I_B$) to ground (G). As shown in FIG. 3D, a MOSFET formed on an insulator may form an effective parasitic bipolar device within its body (137 in FIG. 3D) that may be able to direct ESD energy up to certain levels into body regions (via currents $I_C$ and $I_E$) below the more sensitive gate-body junction (where current $I_D$ flows) and prevent or limit damage at the operative transistor body area near the gate region 54B, source region 52A, and drain region 52B.

As shown in FIG. 1C, an impact ionization current (58A, FIG. 1C, $I_{h\ gen}$, FIG. 3D) may be formed during a strike to the transistor 50 drain Vd region 52B, which may cause a body current (54A, FIG. 1C, $I_B$, FIG. 3D) to flow, activating the base (B) of the effective bipolar device (137, FIG. 3D). The bipolar device 137 may direct the energy from its collector (C) to its emitter (E) via currents $I_C$ and $I_E$, where these current flow deeper within the transistor body 50 than where the more sensitive, normal transistor body current flows (54A, FIG. 1C, $I_B$, FIG. 3D) adjacent the transistor 50 gate-body interface, Vg. Accordingly, a transistor 50 formed on SOI may be able to divert an ESD strike or event away from the sensitive gate-body region 54B near the gate junction to a deeper body region.

Figure 2A:
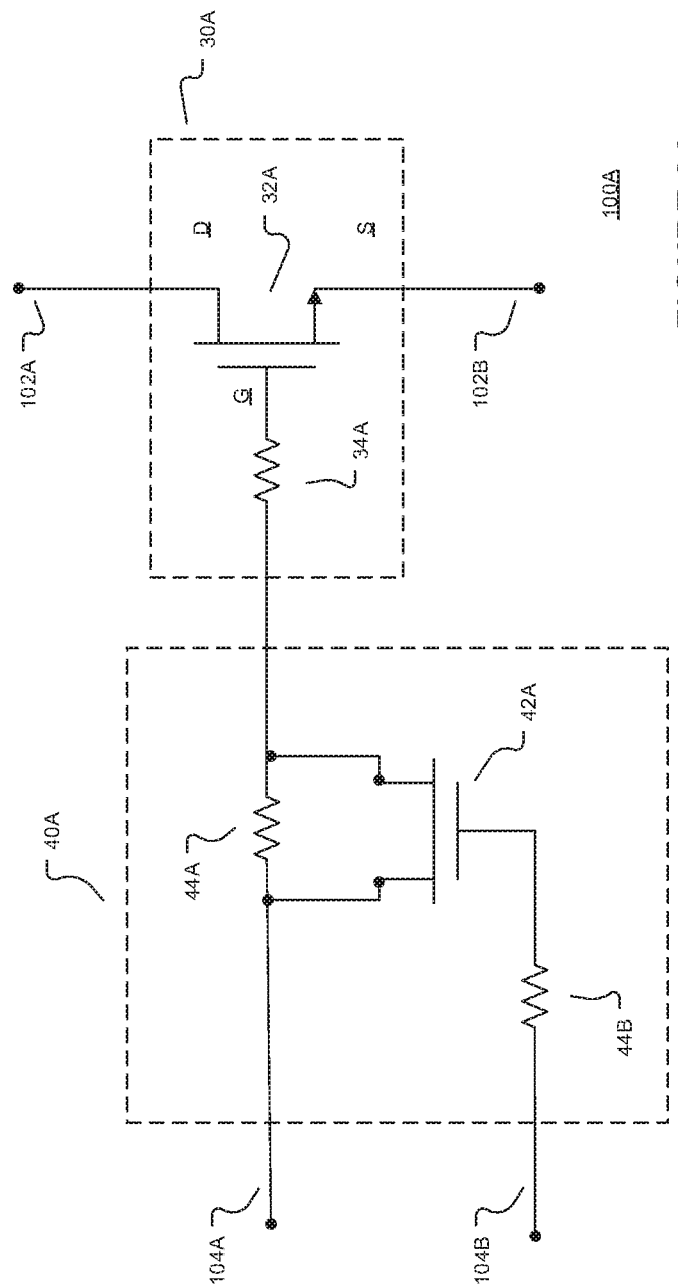
FIG. 2A is a simplified block diagram of a circuit architecture including a switchable gate resistor module according to various embodiments.

In addition to redirecting a limited ESD energy (as shown in FIG. 1C), a transistor 32A, 32B used in architecture 10A, 10B or circuit module 30A, 30B may also be required meet switching times (Tsw) with maximum allowed insertion loss, harmonic signal distortions, and signal intermodulation. As noted, a larger gate resistor 34A may be enable a circuit module 30A (30B) transistor 32A (32A, 32B) to handle larger ESD events but may deleteriously affect (reduce) the transistors 32A (32A, 32B) switching speed (Tsw) and increase signal insertion losses. FIG. 2A is a simplified block diagram of a modified circuit architecture 100A including a switchable gate resistor module (SGRM) 40A and a circuit module 30A according to various embodiments. The SGRM 40A may modulate the effective gate resistance of the circuit module 30A and enable a switch 30A to handle larger ESD events and have a desired switching speed (Tsw). As shown in FIG. 2A, architecture 100A may include a switchable gate resistance module (SGRM) 40A and a circuit module 30A. The SGRM 40A may include resistors 44A, 44B, and a transistor 42A. The transistor 42A source and drain may be coupled about the first resistor 44A. The second resistor 44B may couple a control port 104B to the transistor 42A gate.

In an embodiment, the transistor 42A may be configured to bypass the resistor 44A when architecture 100A is active. The control port 104B may be coupled to architecture 100A power (Vdd) so the transistor 42A is active, bypassing resistor 44A while architecture 100A is receiving power (Vdd). Given the transistor 42A is not switched at high speed, its gate resistor 44B may be made large (400K ohms or greater in an embodiment) to ensure the transistor 42A can withstand an ESD event or strike. As shown in FIG. 2A, the switchable gate resistance module 40A first resistor 44A may be coupled in series with the switch module 30A gate resistor 34A. In an embodiment, the first resistor 44A may also be large relative to the circuit module 30A resistor 34A ohmic size. In an embodiment, the first resistor 44A may have twice or more resistance than the switch 30A resistor 34A.

Figure 2B:
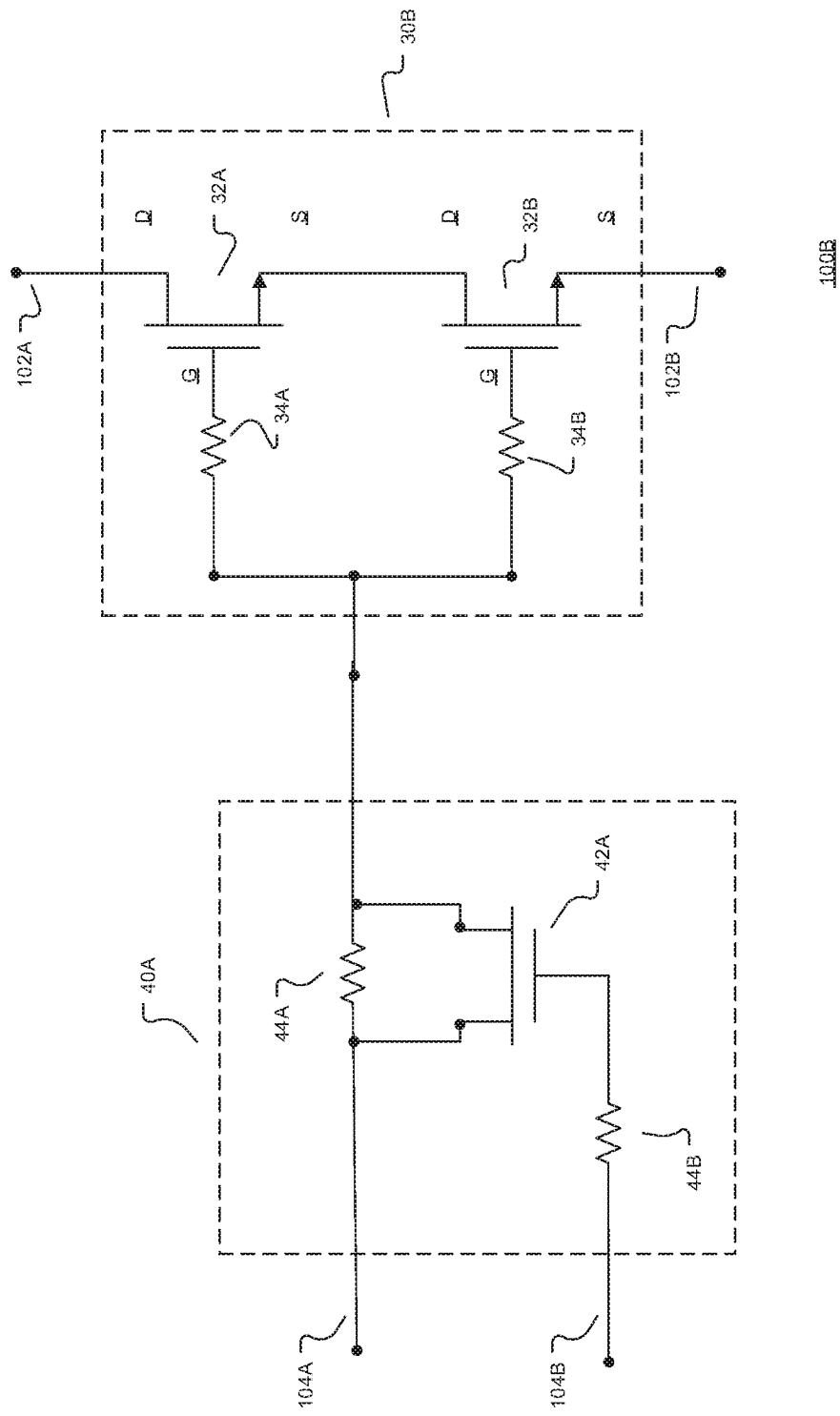
FIG. 2B is a simplified block diagram of a circuit architecture including stacked semiconductor devices and a shared switchable gate resistor module according to various embodiments.

In an embodiment, the switchable gate resistance module 40A first resistor 44A may be hundreds of kilo ohms. The net circuit module 30A gate resistance (44A and 34A), during architecture 100A inactivity (no Vdd power) may be sufficient to handle minimum ESD event requirements while the resistor 34A may be small enough to meet minimum, Tsw switch speed requirements (when Vdd power is present). FIG. 2B is a simplified block diagram of a circuit architecture 100B with a stacked semiconductor device module 30B and a shared switchable gate resistor module (SGRM) 40A according to various embodiments. As shown in FIG. 2B, architecture 100B may include a semiconductor module 30B and a SGRM 40A. The circuit module 30B may include a plurality of stacked semiconductor devices 32A, 32B and gate resistors 34A, 34B. In an embodiment, as shown in FIG. 2B, the SGRM 40A first resistor 44A may be coupled in series with the circuit module's 30B gate resistors 34A and 34B. In an embodiment, the first resistor 44A may be large relative to the circuit module's 30B resistors 34A, 34B ohmic sizes. The first resistor 44A may have twice or more resistance than the circuit module's 30B resistors 34A, 34B, combined or separately.

Figure 2C:
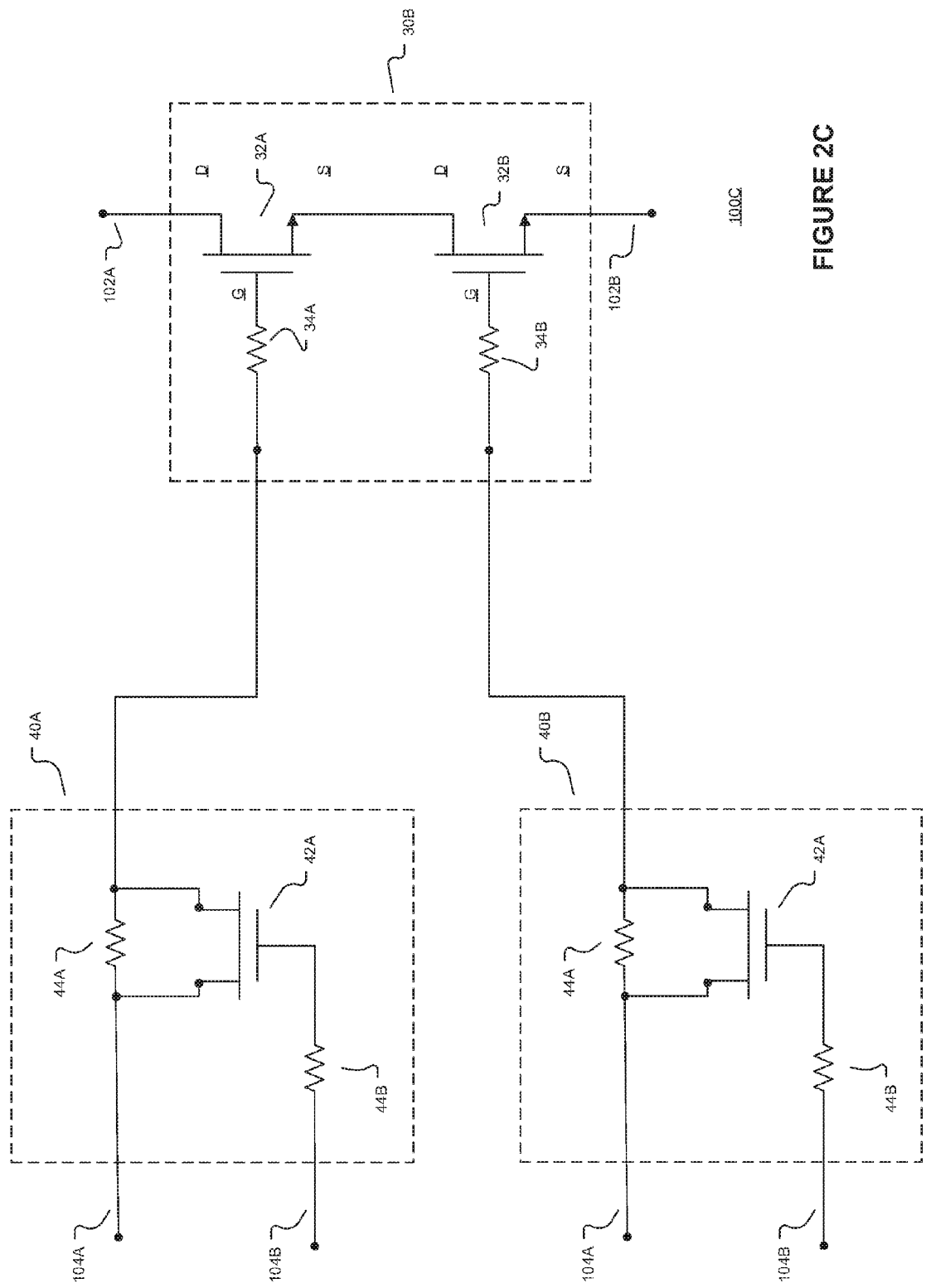
FIG. 2C is a simplified block diagram of another circuit architecture including stacked semiconductor devices and switchable gate resistor modules according to various embodiments.

In an embodiment, the SGRM 40A first resistor 44A may be hundreds of kilo ohms. The net circuit module 30B gate resistance at both transistors 32A, 32B, during architecture 100B inactivity (no Vdd power) may be sufficient to handle minimum ESD event requirements while the resistors 34A, 34B for each transistor 32A, 32B may be small enough to meet minimum, Tsw switch speed requirements (during normal activity –Vdd power present). FIG. 2C is a simplified block diagram of circuit architecture 100C including a stacked semiconductor circuit module 30B and first and second SGRM 40A, 40B according to various embodiments. As shown in FIG. 2C, a separate SGRM 40A, 40B may be coupled to a corresponding transistors 32A, 32B of the circuit module 30B via gate resistors 34A, 34B coupled to the transistors 32A, 32B, respectively.

In an embodiment, the SGRM 40A, 40B first resistors 44A may be hundreds of kilo ohms. The net circuit module 30B gate resistances (44A and 34A and 44A and 34B), during architecture 100C inactivity (no Vdd power) may be sufficient to handle minimum ESD event requirements while the resistors 34A, 34B may be small enough to meet minimum Tsw switch speed requirements during normal activity. FIG. 3A is a simplified block diagram of a system 110A including a circuit module 130A with an accumulated charge sink (ACS) 135A according to various embodiments.

In an embodiment, the circuit module 130A may be coupled to the port 102A and the port 102B. In an embodiment, the circuit module 130A may employed as a switch, in particular an RF switch. The ports 102A, 102B may be RF+ and RF− ports. The circuit module 130A may receive an RF signal on port 102A and generate a modulated RF signal on port 102B based on a signal received at port 104A. As shown in FIG. 3A, the circuit module 130A may include a semiconductor module or device 132A. In an embodiment, the semiconductor modules 132A may include MOSFETs formed on SOS or SOI or other type of floating body semiconductor devices. Based on the signal at port 104A, the circuit module 130A may be inactive periodically during normal operation and thus, operate in an accumulated charge regime (ACR) when a sufficient non-zero voltage is applied to the semiconductor 132A gate during inactivity.

Semiconductor devices operating in an ACR may introduce parasitic capacitance non-linearities, affect the drain-to-source breakdown voltage (BVDSS), and introduce harmonic distortion and intermodulation distortion to a signal processed by the semiconductor 132A including an RF signal at port 102A that is modulated by the transistor 132A. Such RF signal distortions may be unacceptable, particularly when architecture 110A is employed in communication systems. In communication systems, signal distortion may cause unacceptable interface with adjacent signals, violating system operating guidelines and government signal transmission rules.

Any semiconductor device 32A, 32B, 132A-132D (FIG. 3A-5C) operating in ACR may introduce parasitic capacitance non-linearities, affect its drain-to-source breakdown voltage (BVDSS), and produce harmonic distortion, and intermodulation distortion in signals processed by the devices 32A, 32B, 132A-132D. A semiconductor device 32A, 32B, 132A-132D may have a parasitic capacitance formed between the device gate and source, Cgs and the device gate and drain, Cgd. A device's 32A, 32B, 132A-132D parasitic capacitance Cgs and Cds while operating in an ACR may become voltage dependent due to the presence of holes in the device 32A, 32B, 132A-132D body due to accumulated charge. A device operating in an ACR parasitic capacitance Cgs, Cgd may introduce harmonic distortion and intermodulation distortion to signals processed by the devices 32A, 32B, 132A-132D.

As noted, a circuit module 130A including devices 132A may process RF signals and its parasitic capacitance Cgs and Cgd may cause harmonic distortion and intermodulation distortion to the higher frequency content of the RF signals. Architectures 100A-C, 110A-B, 140A-B, and 150A-C (FIGS. 1A-5C) may be employed in systems (such as communication systems or architecture) having distortion limits or requirements for signals generated by such systems including cellular communication devices. For a semiconductor device 32A, 32B, 132A-132D operating in ACR, the drain-to-source resistance may also be reduced. Such a reduction in the drain-to-source resistance may reduce the devices 32A, 32B, 132A-132D drain-to-source breakdown voltage (BVDSS), which may affect architectures 100A-C, 110A-B, 140A-B, and 150A-C desired or required voltage handling performance including ESD handling requirements.

In order to reduce the effects of operating a semiconductor device 132A-132D in ACR, an accumulated charge sink (ACS) 135A, 135B may be coupled to the semiconductor device 132A-132D body. The ACS 135A, 135B may be coupled directly to a device 132A-132D transistor body or be formed on an extension of the body. In an embodiment, a device 132A-132D may be N MOSFET devices where the source and drain are N-type and the body is P-type. An ACS 135A, 135B may include a P doped section and a P+ doped section. An ACS 135A, 135B may include a metal contact or other semiconductor contact to enable conduction of accumulated charge from a device 132A-132D body.

In an embodiment, the ACS 135A, 135B may be coupled to a device 132A-132D (FIGS. 3B, 3C, 4A, 4B, 5A-5C) via one or more circuit components (136A, 136B, FIGS. 3B, 3C, 4A, 4B, 5A-5C) to help reduce or remove accumulated charge in the body of the semiconductor device 132A-132D. In an embodiment, the system 110B shown in FIG. 3B, ACS 135A may be coupled to the device 132A gate via a circuit (136A) to help reduce or remove accumulated charge in the body of the semiconductor device 132A. As shown in FIG. 3B, the circuit module 130B may include a diode 136A. In an embodiment, the semiconductors 132A-132D may include N-type MOSFETs operating in enhancement or depletion mode and the accumulated charge formed in ACR may include holes.

FIG. 3D is current flow diagram 120 for a circuit module 130B during an ESD strike. As shown in FIG. 3B, the circuit module 130B includes a MOSFET and an ACS circuit 136A (a diode in an embodiment) coupling the MOSFET body ($I_B$) to ground (G). During a negative ESD event, the impact ionization current $Ih_{gen}$ may activate a parasitic bipolar device 137 within the FET 132A via base current $I_B$ and enable the parasitic bipolar device 137 to direct the strike or energy away from the FET's 132A sensitive gate junction (where $I_D$ current may flow during normal operation) The diode 136A may not direct negative current from the bipolar device 137 gate to the FET 132A gate. During a positive ESD event, however impact ionization current $Ih_{gen}$ may be transmitted to the gate (G) via the diode 136A in circuit module 130B. In such an embodiment, the parasitic bipolar device 137 gate may not receive sufficient base current $I_B$ to activate the parasitic bipolar device 137. The circuit module 132A, (120 shown in FIG. 3D) may not direct sufficient positive ESD strike or energy away from the gate junction to prevent gate junction damage.

ACR, ACS, circuits, systems, architecture, semiconductors, and methods for reducing accumulated charge in floating body semiconductor devices are described in the following commonly assigned U.S. Applications and Patent: Provisional Application No. 60/698,523, filed on Jul. 11, 2005, entitled "Method and apparatus for use in improving linearity of MOSFETs using an accumulated charge sink;" Provisional Application No. Provisional Application No. 60/718,260, filed on Sep. 15, 2005, entitled "Method and apparatus improving gate oxide reliability by controlling accumulated charge;" application Ser. No. 11/484,370, filed Jul. 10, 2006, which issued Mar. 22, 2011 as U.S. Pat. No. 7,910,993, entitled "METHOD AND APPARATUS FOR USE IN IMPROVING LINEARITY OF MOSFETs USING AN ACCUMULATED CHARGE SINK". All of the above-cited applications and issued patent set forth above are hereby incorporated by reference herein as if set forth in full for their teachings on ACR, ACS, circuits, systems, architecture, semiconductors, and methods for reducing accumulated charge in floating body semiconductor devices.

In an embodiment, the semiconductor devices 32A, 32B, 132A-132D may be include an ACS 135A, 135B. The circuit modules 30A, 30B, 130A-C, 142A, 142B may employ semiconductor modules or devices 32A, 32B, 132A-132D with ACS 135A, 135B. The circuit modules 32A, 32B, 132A-132D may further include an ACS transfer module 139A, 139B or circuit 136A, 136B coupling the ACS 135A, 135B to the device 32A, 32B, 132A-132D to its gate directly or indirectly. In an embodiment, a floating body semiconductor 32A, 32B, 132A-132D may be formed on a die with components to reduce the ACS such as shown and described in the incorporated U.S. Pat. No. 7,910,993.

FIG. 3B is a simplified block diagram of circuit architecture 110B with a semiconductor device 132A and an accumulated charge sink 135A according to various embodiments. FIG. 3C is a simplified block diagram of a circuit architecture 110C with stacked semiconductor devices 132A, 132B and accumulated charge sinks 135A, 135B, respectively according to various embodiments. As shown in FIG. 3B, circuit architecture 110B includes a circuit module 130B, an input port 102A, an output port 102B, and a control signal port 104A. As shown in FIG. 3C, circuit architecture 110C includes a circuit module 130C, an input port 102A, an output port 102B, and a control signal port 104A. In an embodiment, the circuit modules 130B, 130C may be employed as switches including RF switch modules. The circuit modules 130B, 130C may modulate signals on the input port 102A to the output port 102B based on the control signal 104A where the signals may include RF signals.

As shown in FIG. 3B, the circuit module 130B may include a transistor device 132A, a gate resistor 134A, an accumulated charge sink 135A, and an ACS circuit 136A (a diode in an embodiment). The resistor 134A may couple a control signal 104A to the semiconductor transistor 132A gate (G). In an embodiment, the transistor 132A drain (D) or source (S) may be coupled to the input port 102A and the transistor 132A source (S) or drain (D) may be coupled to the output port 102B. As shown in FIG. 3C, the switch module 130C may include stacked transistor devices 132A, 132B, gate resistors 134A, 134B, accumulated charge sinks 135A, 135B, and ACS circuits 136A, 136B (diodes in an embodiment). The resistors 134A, 134B may couple a control signal 104A to the semiconductor transistors 132A, 132B gates (G). In an embodiment, the transistor 132A drain (D) or source (S) may be coupled to the input port 102A and the transistor 132A source (S) or drain (D) may be coupled to the transistor 132B drain (D) or source (S), and the transistor 132B source (S) or drain (D) may be coupled to the output port 102B.

As noted, in a field effect transistor (FET) formed on an insulator (SOI) including sapphire (SOS), accumulated charge may get trapped in the FET when a non-zero voltage signal below threshold is present on the gate (G) of the FET (32A, 32B, 132A-132D), termed operating an accumulated charge regime (ACR). In an embodiment, the transistors 32A, 32B, 132A-132D may be NPN MOSFETs operating in enhancement mode. Such devices may operate when their gate is not negative (zero on device) or exceeds a minimum positive threshold voltage (0.7 volts in an embodiment). Further, the transistors 32A, 32B, 132A, 132B may be formed on an insulator (silicon on insulator, SOI) including sapphire (silicon on sapphire, SOS). Such a transistor 32A, 32B, 132A, 132B may have a floating body and may accumulate trapped charge when a non-zero voltage signal below threshold is present on the gate (G) of the FET (32A, 32B, 132A-132D). Such a charge accumulation may cause operational non-linearities including a non-linear parasitic capacitance, harmonic and intermodulation distortions on a processed signal, and reduce the FETs (32A, 32B, 132A-132D) breakdown voltage.

In order to reduce the trapped charge, the FET (32A, 32B, 132A-132D) may include an ACS 135A, 135B. The FET (32A, 32B, 132A-132D) ACS 135A, 135B may be electrically coupled to another location (on the FET (32A, 32B, 132A-132D) or other circuit location via a circuit (136A, 136B, 139A, 139B) to reduce or eliminate accumulated charge in the FET (32A, 32B, 132A-132D) body. In an embodiment, the circuit 136A, 136B, 139A, 139B may include a diode 136A, 136B coupled to the FET (32A, 32B, 132A-132D) ACS 135A, 135B. The diode 136A, 136B may enable the reduction in accumulated trapped charge in a FET (32A, 32B, 132A-132D). FIG. 3D is current flow diagram 120 for a MOSFET including an ACS circuit 136A (a diode in an embodiment) coupling the MOSFET body ($I_B$) (G). As shown in FIG. 3D, the circuit 136A may move accumulated charge I from the base to the gate where the reduction may eliminate or lessen the effects of operating a FET (32A, 32B, 132A-132D) in a ACR.

As noted with reference to FIGS. 1C and 3D, during an ESD event or strike, impact ionization current ($I_{h.gen}$) may be formed with the FET 132A body. The impact ionization current $I_{h.gen}$ may form a base current $I_B$ that may activate a parasitic bipolar device 137 gate. The bipolar device 137 may redirect ESD energy away from the FET 132A gate-body interface (where current $I_D$ may form during operation) via currents $I_C$ and $I_E$. As noted above, a ACS transfer module 136A, 136B including a diode 136A, 136B may limit or prevent a FET 132A, 132B from directing current below the FET 132A, 132B gate-body interface via the parasitic bipolar device 137 due to the insufficient device 137 base current IB. The diode 136A, 136B may direct impact ionization current $I_{h.gen}$ from the parasitic bipolar device 137 to the FET 132A, 132B gate during a positive ESD event or strike.

Accordingly, while an ACS circuit 136A including a diode may reduce accumulated charge via an ACS 135A, 135B, the ACS circuit 136A may increase body damage during a positive ESD strike by preventing the operation of the parasitic bipolar device 137. ACS reduction, however may be required for system performance as noted above. Accordingly, a circuit or system may need to reduce accumulated charge of incorporated float body semiconductors while not affecting the inherent ESD performance of the incorporated floating body semiconductors during positive and negative ESD strikes.

Figure 4B:
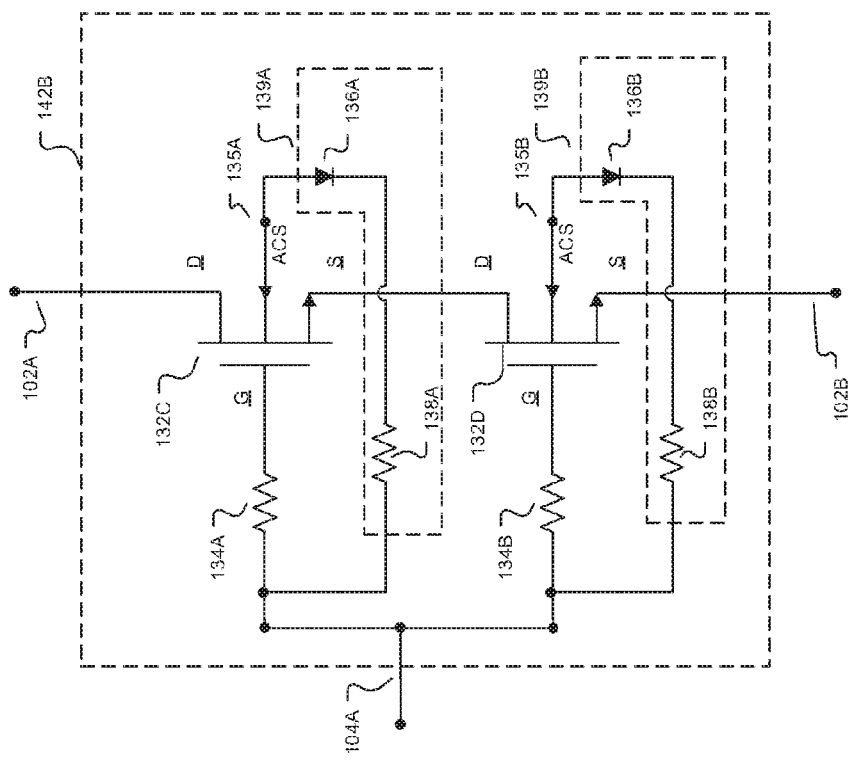
FIG. 4B is a simplified block diagram of a circuit architecture including stacked semiconductor devices and modified accumulated charge sink modules according to various embodiments.
Figure 4A:
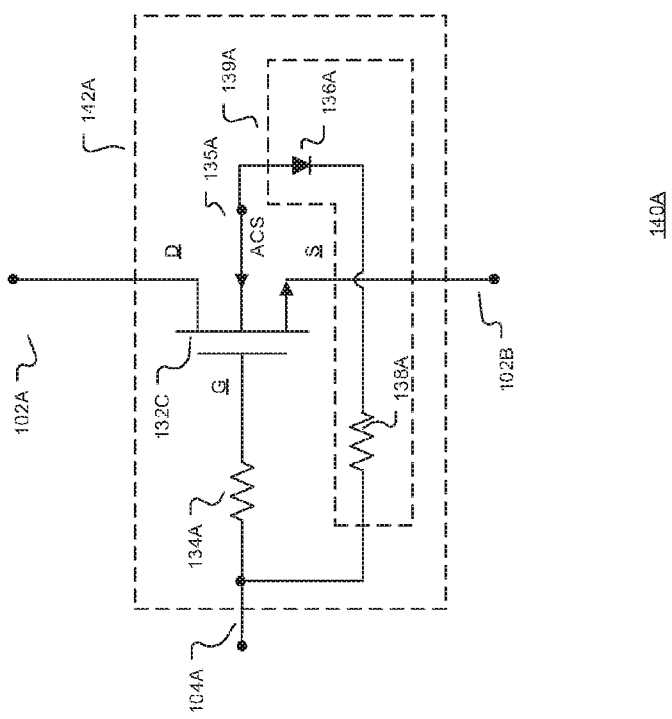
FIG. 4A is a simplified block diagram of a circuit architecture including a semiconductor device and a modified accumulated charge sink module according to various embodiments.
Figure 4D:
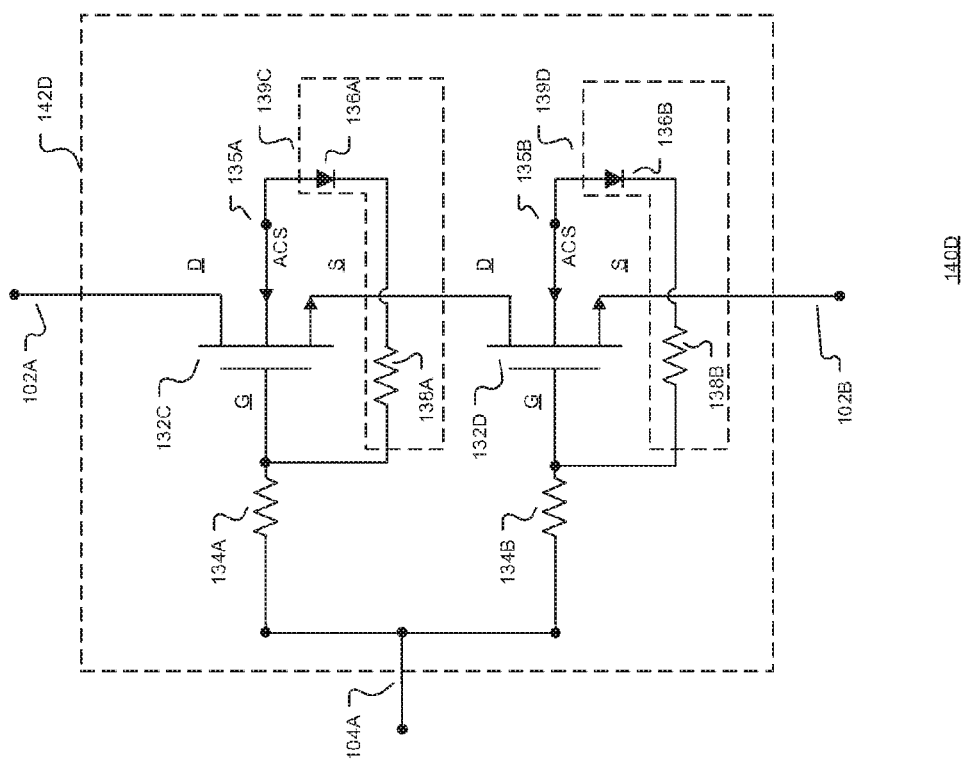
FIG. 4D is a simplified block diagram of a circuit architecture including stacked semiconductor devices and modified accumulated charge sink modules according to various embodiments.
Figure 4C:
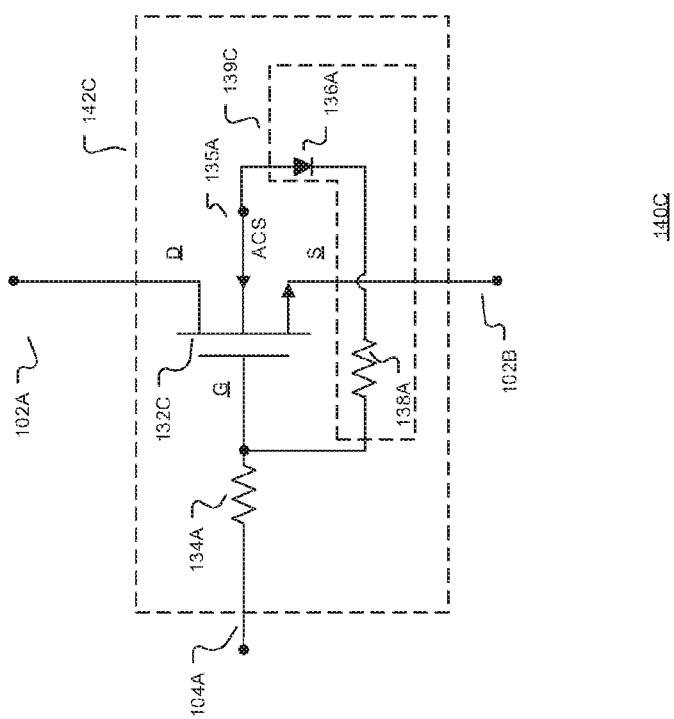
FIG. 4C is a simplified block diagram of a circuit architecture including a semiconductor device and another modified accumulated charge sink module according to various embodiments.

FIGS. 4A and 4C are simplified block diagrams of circuit architecture 140A, 140C with a semiconductor device 132C and an accumulated charge sink (ACS) transfer module 139A, 139C according to various embodiments. FIGS. 4B, 4D are simplified block diagrams of a circuit architecture 140B, 140D with stacked semiconductor devices 132C, 132D and accumulated charge sink (ACS) transfer modules 139A, 139B, and 139C, 139D, respectively according to various embodiments. As shown in FIGS. 4A, 4B, circuit architecture 140A, 140C includes a circuit module 142A, an input port 102A, an output port 102B, and a control signal port 104A. As shown in FIGS. 4B, 4D, circuit architecture 140B, 140D includes a circuit module 142B, 142D, an input port 102A, an output port 102B, and a control signal port 104A. In an embodiment, the circuit modules 142A-D may be employed as switches including RF switches. The circuit modules 142A-D may modulate signals on the input port 102A based on the control signal 104A.

As shown in FIGS. 4A, 4B, the circuit module 142A, 142B may include a transistor device 132C, a gate resistor 134A, an ACS 135A, and an accumulated charge sink transfer module 139A, 139B. The resistor 134A may couple a control signal 104A to the semiconductor transistor 132C gate (G). In an embodiment, the transistor 132C drain (D) or source (S) may be coupled to the input port 102A and the transistor 132C source (S) or drain (D) may be coupled to the output port 102B. As shown in FIGS. 4B, 4D, the circuit module 142B, 142D may include stacked transistor devices 132C, 132D, gate resistors 134A, 134B, and accumulated charge sink transfer modules 139A, 139B and 139C, 139D.

The resistors 134A, 134B may couple the control signal 104A to the semiconductor transistors 132C, 132D gates (G). In an embodiment, the transistor 132A drain (D) or source (S) may be coupled to the input port 102A and the transistor 132C source (S) or drain (D) may be coupled to the transistor 132D drain (D) or source (S), and the transistor 132D source (S) or drain (D) may be coupled to the output port 102B.

In a field effect transistor (FET) formed on an insulator (SOI) including sapphire (SOS), accumulated charge may get trapped in the FET when a non-zero voltage below the FET threshold is present on the FET gate (operating in an ACR). In an embodiment, the transistors 132C, 132D may be NPN MOSFETs operating in enhancement mode. Such devices may operate when their gate is not negative (zero on device) or exceeds a minimum positive threshold voltage (0.7 volts in an embodiment). Further, the transistors 132C, 132D may be formed on an insulator (silicon on insulator, SOI) including sapphire (silicon on sapphire, SOS). Such a transistor 132C, 132D may be a floating body transistor and may accumulate trapped charge when a non-zero voltage below the FET threshold is present on the FET gate. Such a charge accumulation may cause operational non-linearities including a non-linear parasitic capacitance, harmonic and intermodulation distortions to processed signals, and reduced BVDSS (breakdown voltage).

In order to reduce the trapped charge in a FET, a circuit module 142A-D including the FETs 132C, 132D may include ACS 135A, 135B and ACS transfer modules 139A-D. In an embodiment, each ACS transfer module 139A-D may include a diode 136A, 136B. The diodes 136A, 136B may enable a transistor 132C, 132D to reduce accumulated trapped charge. In an embodiment, the ACS transfer modules 139A-D may include a diode 136A, 136B coupled in series with a resistor 138A, 138B. The combination of the coupled diode 136A, 136B and resistor 138A, 138B may couple an ACS 135A, 135B to a. a location between the gate resistor 134A, 134B and the control port 104A (FIGS. 4A and 4B) and b. a location between the gate resistor 134A, 134B and the FET 132C, 132D gate (g) (FIGS. 4C and 4D).

As noted above, during a positive ESD event, impact ionization current $I_{h.gen}$ may be directed away from the parasitic bipolar device 137 base, reducing the device 137 base current ($I_B$) and preventing its activation. The addition of the resistor 138A, 138B to the ACS transfer module 139A, 139B may provide a greater path of resistance for the impact ionization current $I_{h.gen}$ than to the parasitic bipolar device 137 base, increasing the device 137 base current ($I_B$) during a positive ESD event. The bipolar device 137 may then activate and direct current away from the sensitive gate-body interface 54B (FIG. 1C) via current $I_C$ and $I_E$ at the device's 137 collector and emitter. In an embodiment, a resistor 138A, 138B coupled in series with the diode 136A, 136B may be sized to create a greater path of resistance for an ESD strike or energy to the FETs 132C, 132D gate (G) (FIG. 4C, 4D) or resistors 134A, 134B (FIGS. 4A, 4B) than the path to the parasitic bipolar device 137. In an embodiment, an ACS transfer module 139A-D resistor 138A, 138B may be on the order of 100K ohms to Mega ohms. A combination of an ACS transfer module 139A-D coupled to a FET 132A-D as shown in FIGS. 4A-4D may enable the combination to dissipate an ESD strike via a body current away from the sensitive body-gate junction channel 54A while reducing undesirable accumulated charge in the FET 132A-D.

Figure 5A:
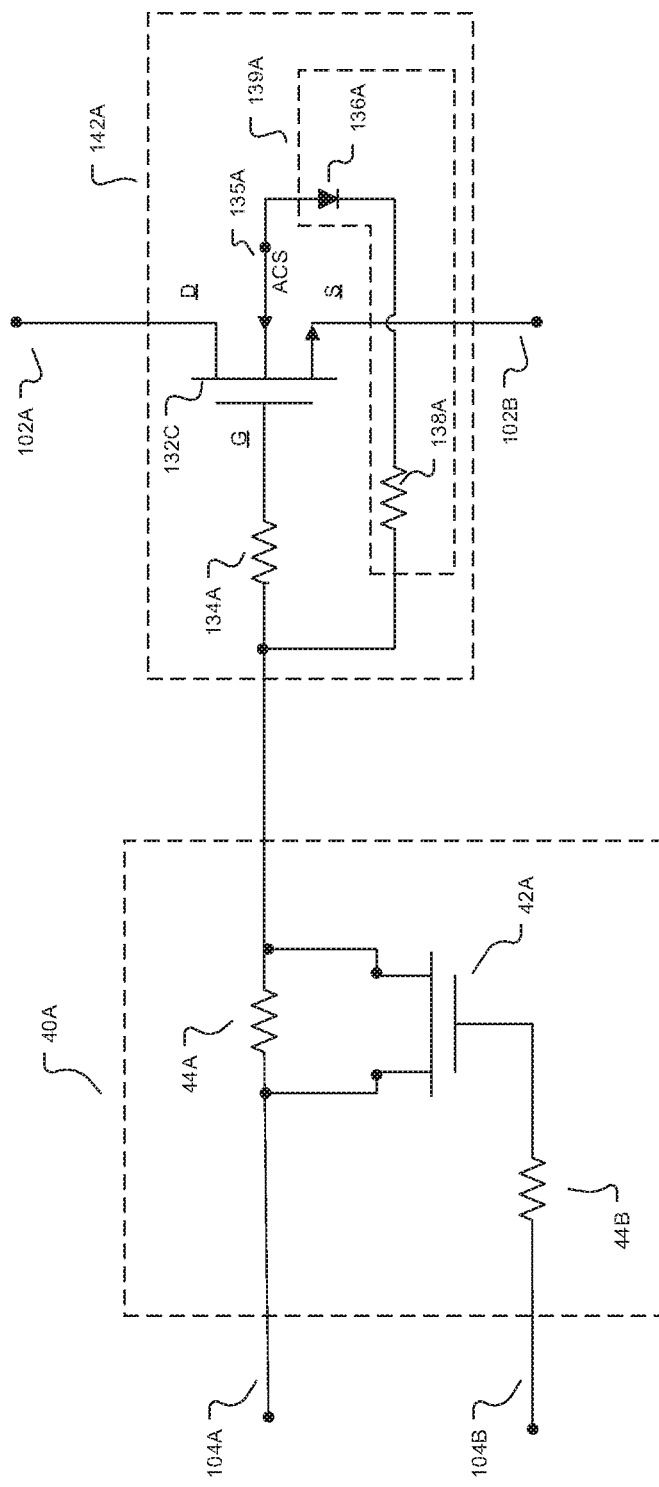
FIG. 5A is a simplified block diagram of a circuit architecture including a semiconductor device, a modified accumulated charge sink module, and a switchable gate resistor module according to various embodiments.

FIG. 5A is a simplified block diagram of a circuit architecture 150A including a SGRM 40A and a circuit module 142A with an ACS transfer module 139A according to various embodiments. The circuit architecture 150A may handle large ESD events and have a desired switching speed (Tsw). As shown in FIG. 5A, architecture 150A may include a SGRM 40A and a circuit module 142A. The circuit module 142A may include an ACS transfer module 139A where the module 139A as described in FIGS. 4A and 4C. The combination of the SGRM 40A and ACS transfer module 139A coupled to the FET 132C may enable architecture 150A to handle large ESD events while achieving required or desired switching performance (speed Tsw).

Figure 5B:
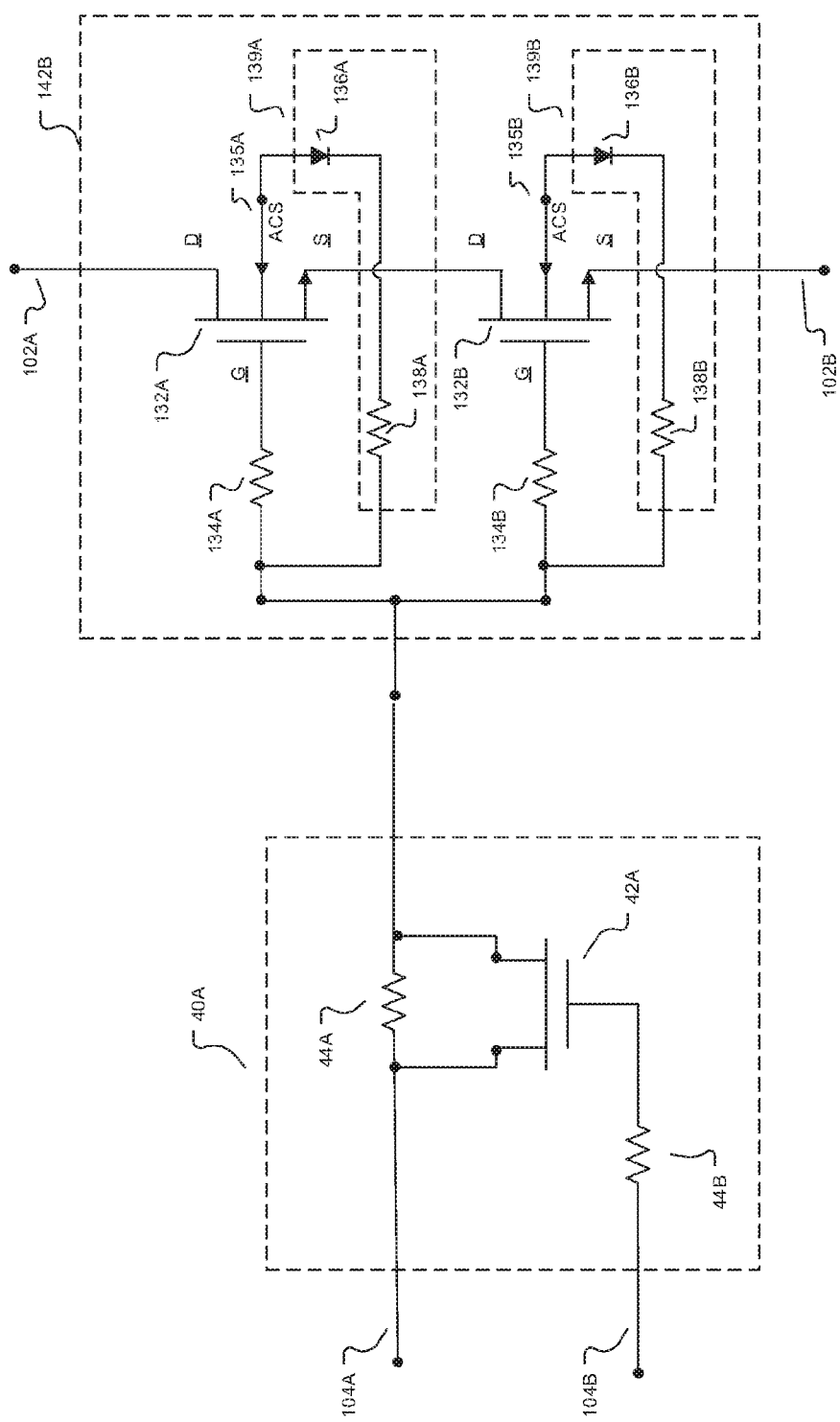
FIG. 5B is a simplified block diagram of a circuit architecture including stacked semiconductor devices, modified accumulated charge sink modules, and a switchable gate resistor module according to various embodiments.

FIG. 5B is a simplified block diagram of a circuit architecture 150B with a stacked semiconductor device circuit module 142B with ACS transfer modules 139A, 193B and a shared SGRM 40A according to various embodiments. The circuit module 142B may include a plurality of stacked semiconductor devices 132A, 132B, gate resistors 134A, 134B, and ACS transfer modules 139A, 139B coupled to each transistor 132A, 132B. In an embodiment, as shown in FIG. 5B, the SGRM 40A first resistor 44A may be coupled in series with the circuit module's 142B gate resistors 134A and 134B. In an embodiment, the first resistor 44A may be large relative to the circuit module's 142B resistors 134A, 134B ohmic sizes. The first resistor 44A may have twice or more resistance than the switch 142B resistors 134A, 134B, combined or separately.

In an embodiment, the SGRM 40A first resistor 44A may be hundreds of kilo ohms. The net circuit module 142B gate resistance at both transistors 132A, 132B, during architecture 150B inactivity (no Vdd power) may be sufficient to handle minimum ESD event requirements while the resistors 134A, 134B for each transistor 132A, 132B may be small enough to meet minimum, Tsw switch speed requirements. The transistors 132A, 132B with ACS transfer modules 139A, 139B may be enable dissipate remaining ESD strike or events (where a portion of the ESD strike or event energy may be absorbed or dissipated by the first resistor 44A). The combination of SGRM 40A and stacked transistors 132A, 132B with ACS transfer modules 139A, 139B may enable architecture 150B to handle required level ESD events or strikes while meeting switch time requirements (Tsw).

Figure 5C:
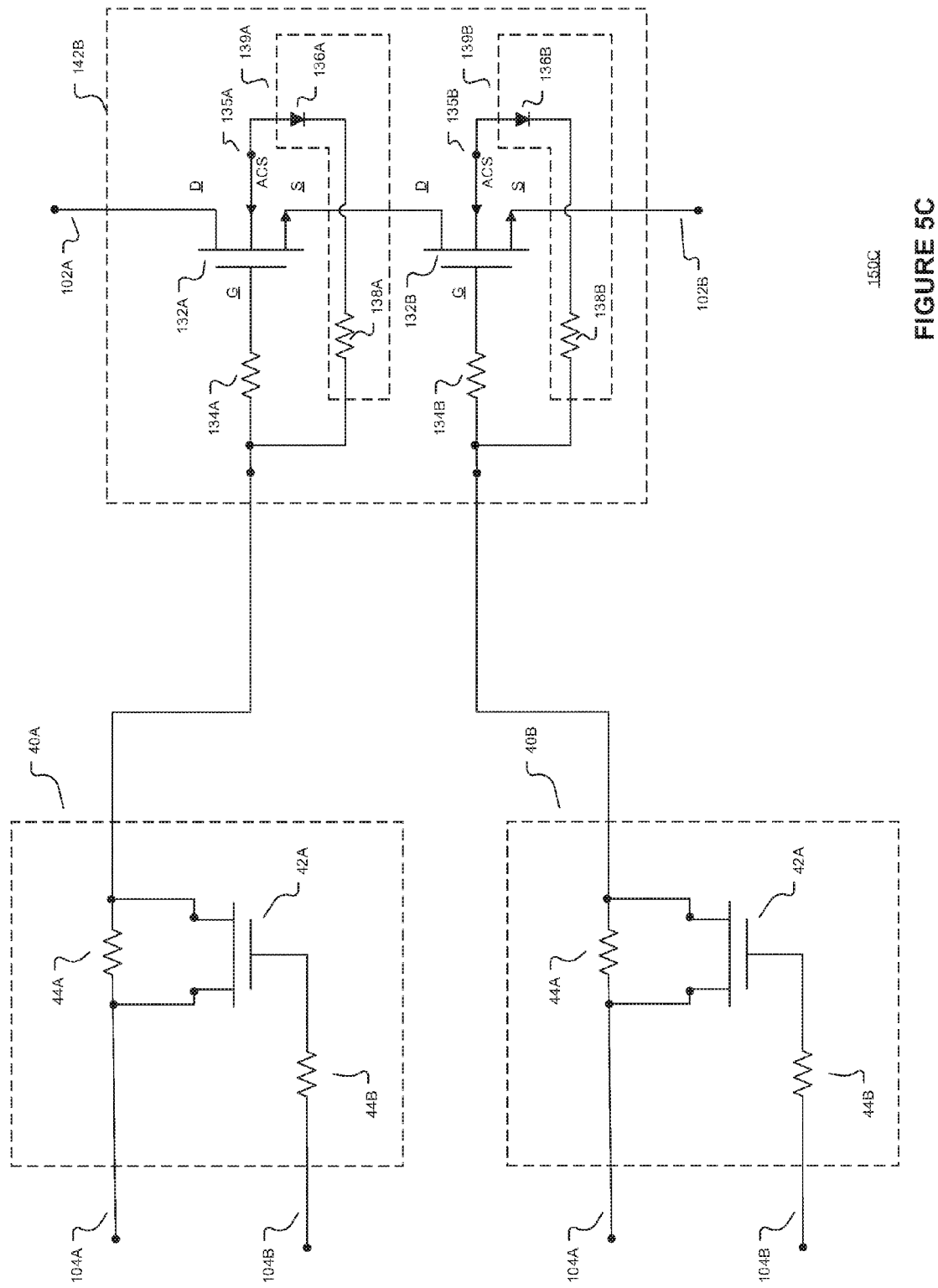
FIG. 5C is a simplified block diagram of another circuit switch architecture including stacked semiconductor devices, modified accumulated charge sink modules, and switchable gate resistor modules according to various embodiments.

FIG. 5C is a simplified block diagram of a circuit architecture 150C including a stacked semiconductor device circuit module 142B with ACS transfer modules 139A, 193B and SGRM 40A, 40B according to various embodiments. The circuit module 142B may include a plurality of stacked semiconductor devices 132A, 132B, gate resistors 134A, 134B, and ACS transfer modules 139A, 139B coupled to each transistor 132A, 132B.

In an embodiment, as shown in FIG. 5C, a first SGRM 40A first resistor 44A may be coupled in series with a circuit module's 142B gate resistor 134A. A second SGRM module 40B first resistor 44A may be coupled in series with a circuit module's 142B gate resistor 134B. In an embodiment, the first resistors 44A may be large relative to the circuit module's 142B resistors 134A, 134B ohmic sizes. The first resistor 44A may have twice or more resistance than the switch 142B resistors 134A, 134B. In an embodiment, the SGRM 40A first resistor 44A may be sized differently than the switchable gate resistance module 40B first resistor 44A.

In an embodiment, the SGRM 40A, 40B first resistors 44A may be hundreds of kilo ohms. The net circuit module 142B gate resistance at both transistors 132A, 132B, during architecture 150B inactivity (no Vdd power) may be sufficient to handle minimum ESD event requirements while the resistors 134A, 134B for each transistor 132A, 132B may be small enough to meet minimum, Tsw switch speed requirements during normal operation. The transistors 132A, 132B with ACS transfer modules 139A, 139B may be able to dissipate remaining ESD strike or events (where a portion of the ESD strike or event energy may be absorbed or dissipated by the first resistors 44A of the SGRM 40A, 40B). The combination of the SGRM 40A, 40B and stacked transistors 132A, 132B with ACS transfer modules 139A, 139B may enable architecture 150C to handle required levels of ESD events or strikes while meeting switch time requirements (Tsw).

Applications that may include the novel apparatus and systems of various embodiments include electronic circuitry used in high-speed computers, communication and signal processing circuitry, modems, single or multi-processor modules, single or multiple embedded processors, data switches, and application-specific modules, including multilayer, multi-chip modules. Such apparatus and systems may further be included as sub-components within a variety of electronic systems, such as televisions, cellular telephones, personal computers (e.g., laptop computers, desktop computers, handheld computers, tablet computers, etc.), workstations, radios, video players, audio players (e.g., mp3 players), vehicles, medical devices (e.g., heart monitor, blood pressure monitor, etc.) and others. Some embodiments may include a number of methods.

It may be possible to execute the activities described herein in an order other than the order described. Various activities described with respect to the methods identified herein can be executed in repetitive, serial, or parallel fashion.

A software program may be launched from a computer-readable medium in a computer-based system to execute functions defined in the software program. Various programming languages may be employed to create software programs designed to implement and perform the methods disclosed herein. The programs may be structured in an object-orientated format using an object-oriented language such as Java or C++. Alternatively, the programs may be structured in a procedure-orientated format using a procedural language, such as assembly or C. The software components may communicate using a number of mechanisms well known to those skilled in the art, such as application program interfaces or inter-process communication techniques, including remote procedure calls. The teachings of various embodiments are not limited to any particular programming language or environment.

The accompanying drawings that form a part hereof show, by way of illustration and not of limitation, specific embodiments in which the subject matter may be practiced. The embodiments illustrated are described in sufficient detail to enable those skilled in the art to practice the teachings disclosed herein. Other embodiments may be utilized and derived there-from, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein individually or collectively by the term "invention" merely for convenience and without intending to voluntarily limit the scope of this application to any single invention or inventive concept, if more than one is in fact disclosed. Thus, although specific embodiments have been illustrated and described herein, any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

The Abstract of the Disclosure is provided to comply with 37 C.F.R. § 1.72(b), requiring an abstract that will allow the reader to quickly ascertain the nature of the technical disclosure. It is submitted with the understanding that it will not be used to interpret or limit the scope or meaning of the claims. In the foregoing Detailed Description, various features are grouped together in a single embodiment for the purpose of streamlining the disclosure. This method of disclosure is not to be interpreted to require more features than are expressly recited in each claim. Rather, inventive subject matter may be found in less than all features of a single disclosed embodiment. Thus the following claims are hereby incorporated into the Detailed Description, with each claim standing on its own as a separate embodiment.

What is claimed is:
1. An electronic circuit including:
 (a) at least one field effect transistor (FET), each FET including:
  (1) a gate, a drain, a source, and a body;
  (2) a gate resistor series connected to the gate of such FET;
  (3) an accumulated charge sink (ACS) circuit connected to the body of such FET; and
  (4) an ACS resistance series connected to the ACS circuit, wherein the series-connected ACS resistance and the ACS circuit are connected to the gate resistor of such FET at a node opposite to the connection of the gate resistor to the gate; and
 (b) at least one electrostatic discharge (ESD) protection electronic circuit, each ESD protection electronic circuit including:
  (1) a selectable resistor coupled in series between a common control terminal for at least one FET and the gate resistor of at least one FET; and
  (2) a bypass module coupled in parallel with the selectable resistor and having a control signal input for receiving a control signal, the bypass module being configured to respond to the control signal to (A) in a bypass mode, conduct signals applied to the coupled common control terminal through the bypass module and around the selectable resistor, and (B) in a protection mode, cause signals applied to the coupled common control terminal to be conducted through the selectable resistor, wherein in the bypass mode, the bypass module presents no significant added resistance, relative to the gate resistor of the at least one coupled FET, to signals applied to the coupled common control terminal.

2. The invention of claim 1, wherein the resistance of the ACS resistance is sized to provide substantial ESD tolerance without substantially impairing the function of the ACS circuit.

3. The invention of claim 1, wherein the resistance of the ACS resistance has at least 10 times the resistance of the gate resistor.

4. The invention of claim 1, wherein the ACS circuit is a diode.

5. The invention of claim 1, wherein the electronic circuit is fabricated as an integrated circuit on one of a semiconductor-on-insulator substrate or a silicon-on-sapphire substrate.

6. The invention of claim 1, wherein at least one FET conducts radio frequency signals between its source and drain in response to a signal applied to the common control terminal.

7. The invention of claim 1, wherein the bypass module includes a bypass FET having a gate, a drain, a source, and a gate resistor series connected to the gate of the bypass FET, wherein the source and drain of the bypass FET are coupled across the selectable resistor, and the gate resistor of the bypass FET is coupled to the control signal input.

8. The invention of claim 7, wherein the bypass FET and the at least one FET are MOSFETs.

9. The invention of claim 8, wherein the MOSFETs are floating body MOSFETs.

10. The invention of claim 1, wherein the selectable resistor has twice or more resistance than the gate resistors.

11. The invention of claim 1, wherein the protection mode persists when no electrical power is applied to the electronic circuit.

12. An integrated circuit including:
(a) at least two stacked field effect transistors (FET), each FET including:
(1) a gate, a drain, a source, and a body:
(2) a gate resistor series connected to the gate of such FET;
(3) an accumulated charge sink (ACS) circuit connected to the body of such FET; and
(4) an ACS resistance series connected to the ACS circuit, wherein the series-connected ACS resistance and the ACS circuit are connected to the gate resistor of such FET at a node opposite to the connection of the gate resistor to the gate; and
(b) at least one electrostatic discharge (ESD) protection electronic circuit, each ESD protection electronic circuit including:
(1) a selectable resistor coupled in series between a common control terminal for at least one FET and the gate resistor of at least one FET; and
(2) a bypass module coupled in parallel with the selectable resistor and having a control signal input for receiving a control signal, the bypass module being configured to respond to the control signal to (A) in a bypass mode, conduct signals applied to the coupled common control terminal through the bypass module and around the selectable resistor, and (B) in a protection mode, cause signals applied to the coupled common control terminal to be conducted through the selectable resistor, wherein in the bypass mode, the bypass module presents no significant added resistance, relative to the gate resistor of the at least one coupled FET, to signals applied to the coupled common control terminal.

13. The invention of claim 12, wherein the resistance of the ACS resistance is sized to provide substantial ESD tolerance without substantially impairing the function of the ACS circuit.

14. The invention of claim 12, wherein the resistance of the ACS resistance has at least 10 times the resistance of the gate resistor.

15. The invention of claim 12, wherein the ACS circuit is a diode.

16. The invention of claim 12, wherein the integrated circuit is fabricated on one of a semiconductor-on-insulator substrate or a silicon-on-sapphire substrate.

17. The invention of claim 12, wherein at least one FET conducts radio frequency signals between its source and drain in response to a signal applied to the common control terminal.

18. The invention of claim 12, wherein the bypass module includes a bypass FET having a gate, a drain, a source, and a gate resistor series connected to the gate of the bypass FET, wherein the source and drain of the bypass FET are coupled across the selectable resistor, and the gate resistor of the bypass FET is coupled to the control signal input.

19. The invention of claim 18, wherein the bypass FET and the at least one FET are MOSFETs.

20. The invention of claim 19, wherein the MOSFETs are floating body MOSFETs.

21. The invention of claim 12, wherein the selectable resistor has twice or more resistance than the gate resistors.

22. The invention of claim 12, wherein the protection mode persists when no electrical power is applied to the integrated circuit.

23. A method for improving electrostatic discharge tolerance and switching speed in an integrated circuit, including:
(a) providing at least one field effect transistor (FET), each FET including:
(1) a gate, a drain, a source, and a body;
(2) a gate resistor series connected to the gate of such FET;
(3) an accumulated charge sink (ACS) circuit connected to the body of such FET; and
(4) an ACS resistance series connected to the ACS circuit, wherein the series-connected ACS resistance and the ACS circuit are connected to the gate resistor of such FET at a node opposite to the connection of the gate resistor to the gate; and
(b) providing at least one electrostatic discharge (ESD) protection electronic circuit, each ESD protection electronic circuit including:
(1) a selectable resistor coupled in series between a common control terminal for at least one FET and the gate resistor of at least one FET; and
(2) a bypass module coupled in parallel with the selectable resistor and having a control signal input for receiving a control signal, the bypass module being configured to respond to the control signal to (A) in a bypass mode, conduct signals applied to the coupled common control terminal through the bypass module and around the selectable resistor, and (B) in a protection mode, cause signals applied to the coupled common control terminal to be conducted through the selectable resistor, wherein in the bypass mode, the bypass module presents no significant added resistance, relative to the gate resistor of the at least one coupled FET, to signals applied to the coupled common control terminal.

24. The method of claim 23, further including sizing the resistance of the ACS resistance to provide substantial ESD tolerance without substantially impairing the function of the ACS circuit.

25. The method of claim 23, further including setting the resistance of the ACS resistance to be at least 10 times the resistance of the gate resistor.

26. The method of claim 23, wherein the ACS circuit is a diode.

27. The method of claim 23, further including fabricating the integrated circuit on one of a semiconductor-on-insulator substrate or a silicon-on-sapphire substrate.

28. The method of claim 23, wherein at least one FET conducts radio frequency signals between its source and drain in response to a signal applied to the common control terminal.

29. The method of claim 23, wherein the bypass module includes a bypass FET having a gate, a drain, a source, and a gate resistor series connected to the gate of the bypass FET, wherein the source and drain of the bypass FET are coupled across the selectable resistor, and the gate resistor of the bypass FET is coupled to the control signal input.

30. The method of claim 29, wherein the bypass FET and the at least one FET are MOSFETs.

31. The method of claim 30, wherein the MOSFETs are floating body MOSFETs.

32. The method of claim 23, wherein the selectable resistor has twice or more resistance than the gate resistors.

33. The method of claim 23, wherein the protection mode persists when no electrical power is applied to the integrated circuit.

34. An integrated circuit including:
   (a) at least one field effect transistor (FET) configured to switch or process a radio frequency signal, each FET including:
      (1) a gate, a drain, a source, and a body:
      (2) a gate resistor series connected to the gate of such FET at a first node and having a second node resistively separated from the first node;
      (3) an accumulated charge sink (ACS) diode connected to the body of such FET; and
      (4) at least one ACS resistance series connected to the ACS diode, wherein the series-connected at least one ACS resistance and the ACS diode are connected to the second node, and the at least one ACS resistance is sized to provide substantial ESD tolerance without substantially impairing the function of the ACS diode; and
   (b) at least one electrostatic discharge (ESD) protection electronic circuit, each ESD protection electronic circuit including:
      (1) a selectable resistor coupled in series between (A) a common control terminal for at least one FET and (B) at least one second node; and
      (2) a bypass module coupled in parallel with the selectable resistor and having a control signal input for receiving a control signal, the bypass module being configured to respond to the control signal to (A) in a bypass mode, conduct signals applied to the coupled common control terminal through the bypass module and around the selectable resistor, and (B) in a protection mode, cause signals applied to the coupled common control terminal to be conducted through the selectable resistor, wherein in the bypass mode, the bypass module presents no significant added resistance, relative to the gate resistor of the at least one coupled FET, to signals applied to the coupled common control terminal.

35. The invention of claim 34, wherein the total resistance of the at least one ACS resistance has at least 10 times the resistance of the gate resistor.

36. The invention of claim 34, wherein the integrated circuit is fabricated on one of a semiconductor-on-insulator substrate or a silicon-on-sapphire substrate.

37. The invention claim 34, wherein the integrated circuit is fabricated on one of a semiconductor-on-insulator substrate or a silicon-on-sapphire substrate.

38. The invention of claim 34, wherein the bypass module includes a bypass FET having a gate, a drain, a source, and a gate resistor series connected to the gate of the bypass FET, wherein the source and drain of the bypass FET are coupled across the selectable resistor, and the gate resistor of the bypass FET is coupled to the control signal input.

39. The invention of claim 38, wherein the bypass FET and the at least one FET are MOSFETs.

40. The invention of claim 39, wherein the MOSFETs are floating body MOSFETs.

41. The invention of claim 34, wherein the selectable resistor has twice or more resistance than the gate resistors.

42. The invention of claim 34, wherein the protection mode persists when no electrical power is applied to the integrated circuit.

* * * * *